(12) United States Patent
Stavenga et al.

(10) Patent No.: US 7,969,548 B2
(45) Date of Patent: Jun. 28, 2011

(54) LITHOGRAPHIC APPARATUS AND LITHOGRAPHIC APPARATUS CLEANING METHOD

(75) Inventors: Marco Koert Stavenga, Eindhoven (NL); Hans Jansen, Eindhoven (NL); Peter Franciscus Wanten, Mierlo (NL); Johannes Wilhelmus Jacobus Leonardus Cuijpers, Roermond (NL); Raymond Gerardus Marius Beeren, Dalhem (BE)

(73) Assignee: ASML Netherlands B.V., Veldhoven (NL)

( * ) Notice: Subject to any disclaimer, the term of this patent is extended or adjusted under 35 U.S.C. 154(b) by 388 days.

(21) Appl. No.: 11/437,876

(22) Filed: May 22, 2006

(65) Prior Publication Data

US 2007/0285631 A1 Dec. 13, 2007

(51) Int. Cl.
G03B 27/52 (2006.01)
B08B 3/12 (2006.01)

(52) U.S. Cl. ............................................ 355/30; 134/1
(58) Field of Classification Search .................... 355/30, 355/53; 134/1
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,405,701 A | 9/1983 | Banks et al. | 430/5 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,143,103 A * | 9/1992 | Basso et al. | 134/98.1 |
| 5,610,683 A | 3/1997 | Takahashi | 355/53 |
| 5,715,039 A | 2/1998 | Fukuda et al. | 355/53 |
| 5,783,790 A | 7/1998 | Mitsumori et al. | 204/157.15 |
| 5,825,043 A | 10/1998 | Suwa | 250/548 |
| 5,837,662 A | 11/1998 | Chai et al. | 510/175 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,496,257 B1 | 12/2002 | Taniguchi et al. | 356/239.2 |
| 6,600,547 B2 | 7/2003 | Watson et al. | 355/30 |
| 6,603,130 B1 | 8/2003 | Bisschops et al. | 250/492.1 |
| 6,955,485 B2 | 10/2005 | Ono et al. | |
| 7,050,146 B2 | 5/2006 | Duineveld et al. | 355/30 |
| 7,091,502 B2 | 8/2006 | Gau et al. | 250/492.2 |
| 7,224,427 B2 | 5/2007 | Chang et al. | 355/30 |

(Continued)

FOREIGN PATENT DOCUMENTS

CN 1963673 5/2007

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Hung Henry Nguyen
*Assistant Examiner* — Steven H Whitesell-Gordon
(74) *Attorney, Agent, or Firm* — Pillsbury Winthrop Shaw Pittman LLP (57) ABSTRACT

An immersion lithographic projection apparatus having a megasonic transducer configured to clean a surface and a method of using megasonic waves to clean a surface of an immersion lithographic projection apparatus are disclosed.

34 Claims, 4 Drawing Sheets

U.S. PATENT DOCUMENTS

| | | | |
|---|---|---|---|
| 7,224,434 B2 | 5/2007 | Tokita | 355/53 |
| 7,307,263 B2 | 12/2007 | Bakker et al. | 250/492.2 |
| 7,315,033 B1 | 1/2008 | Pawloski et al. | 250/492.2 |
| 7,385,670 B2 | 6/2008 | Compen et al. | 355/30 |
| 7,405,417 B2 | 7/2008 | Stevens et al. | 250/504 R |
| 7,462,850 B2 | 12/2008 | Banine et al. | 250/504 R |
| 2001/0032657 A1* | 10/2001 | Itzkowitz | 134/1.3 |
| 2002/0020821 A1 | 2/2002 | Van Santen et al. | 250/492 |
| 2002/0102852 A1* | 8/2002 | Verhaverbeke et al. | 438/690 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0119954 A1 | 6/2004 | Kawashima et al. | 355/30 |
| 2004/0125351 A1 | 7/2004 | Krautschik | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0194812 A1 | 10/2004 | Matsuno et al. | 134/27 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1* | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0048223 A1 | 3/2005 | Pawloski et al. | 427/600 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132731 A1 | 6/2005 | Nakamura et al. | 62/160 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0158473 A1 | 7/2005 | Raykin et al. | 427/299 |
| 2005/0175776 A1 | 8/2005 | Streefkerk et al. | 427/256 |
| 2005/0200815 A1 | 9/2005 | Akamatsu | 353/54 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233056 A1 | 10/2005 | Tokita | 427/256 |
| 2005/0264774 A1 | 12/2005 | Mizutani et al. | 355/30 |
| 2005/0274898 A1 | 12/2005 | Watanabe et al. | 250/372 |
| 2006/0023185 A1 | 2/2006 | Hazelton et al. | 355/53 |
| 2006/0028626 A1 | 2/2006 | Chang et al. | 355/30 |
| 2006/0028628 A1 | 2/2006 | Lin et al. | 355/30 |
| 2006/0050351 A1 | 3/2006 | Higashiki | 359/228 |
| 2006/0103818 A1 | 5/2006 | Holmes et al. | 355/53 |
| 2006/0132731 A1 | 6/2006 | Jansen et al. | 355/30 |
| 2006/0232757 A1 | 10/2006 | Tani et al. | 355/53 |
| 2006/0250588 A1 | 11/2006 | Brandl | 355/30 |
| 2006/0256316 A1 | 11/2006 | Tanno et al. | 355/72 |
| 2007/0002296 A1 | 1/2007 | Chang et al. | 355/53 |
| 2007/0026345 A1 | 2/2007 | Subramanian et al. | 430/311 |
| 2007/0064215 A1 | 3/2007 | Dirksen et al. | 355/77 |
| 2007/0076197 A1 | 4/2007 | Koga | 356/237.3 |
| 2007/0085989 A1 | 4/2007 | Nagahashi et al. | 355/53 |
| 2007/0091287 A1 | 4/2007 | Chang et al. | 355/30 |
| 2007/0127001 A1 | 6/2007 | Van Der Hoeven | 355/53 |
| 2007/0146657 A1 | 6/2007 | Van Mierlo et al. | 355/30 |
| 2007/0146658 A1 | 6/2007 | Van Mierlo et al. | 355/30 |
| 2007/0159610 A1 | 7/2007 | Shiraishi | 355/53 |
| 2007/0172234 A1 | 7/2007 | Shigemori et al. | 396/611 |
| 2007/0206279 A1 | 9/2007 | Brueck et al. | 359/391 |
| 2007/0229789 A1 | 10/2007 | Kawamura | 355/53 |
| 2007/0247600 A1 | 10/2007 | Kobayashi et al. | 355/30 |
| 2007/0251543 A1 | 11/2007 | Singh | 134/1 |
| 2007/0253710 A1 | 11/2007 | Kaneyama et al. | 396/611 |
| 2007/0258072 A1 | 11/2007 | Nagasaka et al. | 355/53 |
| 2007/0274711 A1 | 11/2007 | Kaneyama et al. | 396/611 |
| 2007/0285631 A1* | 12/2007 | Stavenga et al. | 355/30 |
| 2008/0002162 A1 | 1/2008 | Jansen et al. | 355/30 |
| 2008/0049201 A1 | 2/2008 | Stavenga et al. | 355/30 |
| 2008/0218712 A1 | 9/2008 | Compen et al. | 355/30 |
| 2008/0284990 A1 | 11/2008 | De Jong et al. | 355/30 |
| 2009/0025753 A1 | 1/2009 | De Jong et al. | 134/10 |
| 2009/0027635 A1 | 1/2009 | De Jong et al. | 355/30 |
| 2009/0027636 A1 | 1/2009 | Leenders et al. | 355/30 |

FOREIGN PATENT DOCUMENTS

| | | |
|---|---|---|
| DE | 206 607 | 2/1984 |
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1777589 | 4/2004 |
| EP | 1420300 A2 | 5/2004 |
| EP | 1486827 | 12/2004 |
| EP | 1510871 | 3/2005 |
| EP | 1420300 A3 | 8/2005 |
| EP | 1 783 822 A1 | 5/2007 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2000-323396 | 11/2000 |
| JP | 2001-091849 | 4/2001 |
| JP | 2004-193252 | 7/2004 |
| JP | 2005-072404 | 3/2005 |
| JP | 2005-079222 | 3/2005 |
| JP | 2006-32750 A | 2/2006 |
| JP | 2006-134999 | 5/2006 |
| JP | 2006-310706 | 11/2006 |
| JP | 2007-029973 | 2/2007 |
| JP | 2007-088328 | 4/2007 |
| JP | 2007-142217 | 6/2007 |
| JP | 2007-150102 | 6/2007 |
| JP | 2007-227543 | 9/2007 |
| JP | 2007-227580 | 9/2007 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/105107 | 12/2004 |
| WO | WO 2005/006396 | 1/2005 |

| | | |
|---|---|---|
| WO | WO 2005/010611 | 2/2005 |
| WO | WO 2005/024517 | 3/2005 |
| WO | WO 2005/122218 | 12/2005 |
| WO | WO 2005/124833 A1 | 12/2005 |
| WO | WO 2006/041086 | 4/2006 |
| WO | WO 2006/062065 | 6/2006 |
| WO | WO 2006/122578 | 11/2006 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040.

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

European Search Report dated Aug. 7, 2007, issued for European Application No. 07251915.0.

Suwa et al. (Reissue Application of U.S. Patent No. 6,191,429 B1), U.S. Appl. No. 10/367,910, filed Feb. 19, 2003.

De Jong et al., U.S. Appl. No. 11/819,949, filed Jun. 29, 2007.

Jansen et al., U.S. Appl. No. 11/819,954, filed Jun. 29, 2007.

De Jong et al., U.S. Appl. No. 11/819,954, filed Jun. 29, 2007.

European Office Action for Application No. 07 251 915.0 dated Jul. 13, 2009.

Duineveld et al. (Reissue Application of U.S. Patent No. 7,050,146 B1), U.S. Appl. No. 12/153,717, filed May 22, 2008.

Kadjik et al., U.S. Appl. No. 12/233,000, filed Sep. 26, 2008.

Strrefkerk et al., U.S. Appl. No. 12/237,557, filed Sep. 25, 2008.

De Jong et al., U.S. Appl. No. 12/289,621, filed Oct. 30, 2008.

De Jong et al., U.S. Appl. No. 12/314,611, filed Dec. 12, 2008.

De Graaf et al., U.S. Appl. No. 12/318,037, filed Dec. 19, 2008.

De Jong, U.S. Appl. No. 12/358,000, filed Jan. 22, 2009.

* cited by examiner

LITHOGRAPHIC APPARATUS AND LITHOGRAPHIC APPARATUS CLEANING METHOD

FIELD

The present invention relates to a lithographic apparatus and a method for cleaning a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

Figure 2:
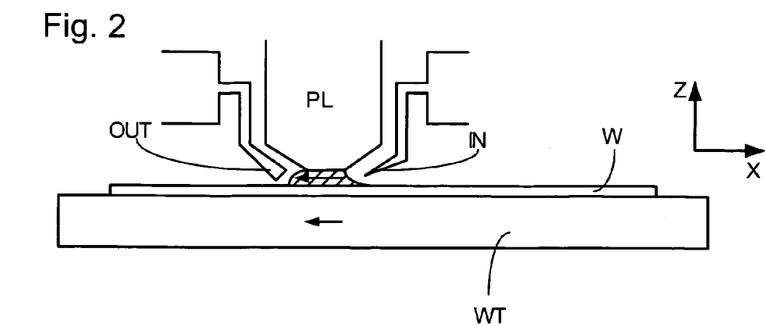
FIGS. 2 and 3 depict a liquid supply system for use in a lithographic projection apparatus.
Figure 3:
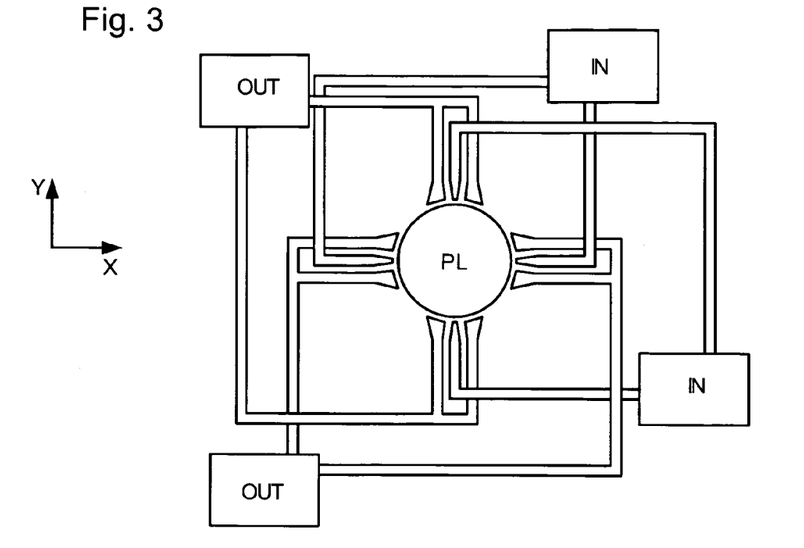

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
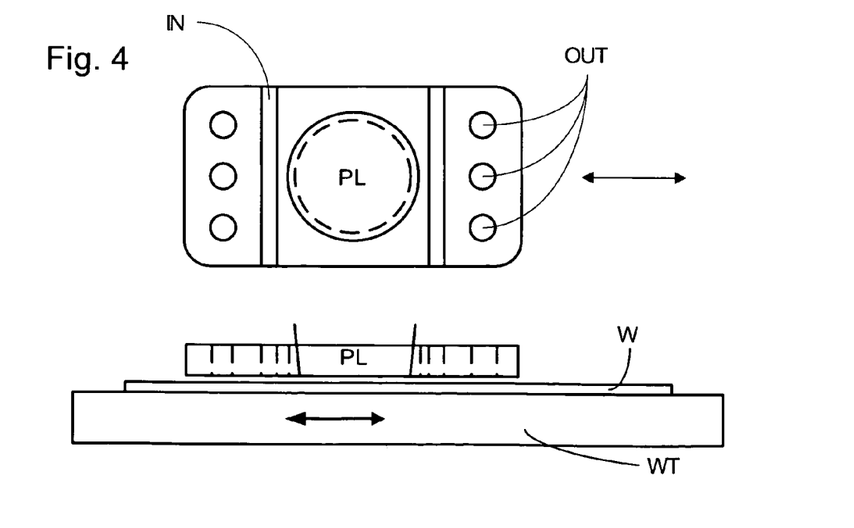
FIG. 4 depicts a another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Immersion liquid may lift debris or particles (e.g. left over from the manufacturing process) from parts of the lithographic apparatus and/or substrates or erode components so as to introduce particles. This debris may then be left behind on the substrate after imaging or may interfere with the imaging while in suspension in the liquid between the projection system and the substrate. Thus, the issue of contamination should be addressed in an immersion lithographic apparatus.

SUMMARY

It is desirable, for example, to provide a lithographic apparatus which can easily and effectively be cleaned as well as to provide a method for effectively cleaning an immersion lithographic apparatus.

According to an aspect of the invention, there is provided An immersion lithographic projection apparatus, comprising: a substrate table constructed and arranged to hold a substrate; a projection system configured to project a patterned beam of radiation onto the substrate; a megasonic transducer configured to clean a surface; and a liquid supply system constructed and arranged to supply liquid between the megasonic transducer and the surface to be cleaned.

According to an aspect of the invention, there is provided An immersion lithographic projection apparatus, comprising: a substrate table constructed and arranged to hold a substrate; a projection system configured to project a patterned beam of radiation onto the substrate; a megasonic transducer configured to clean a surface, the megasonic transducer being moveable relative to the surface such that, in a cleaning mode, a direct straight path through liquid exists between the megasonic transducer and the surface; and a liquid supply system configured to provide liquid between the transducer and the surface.

According to an aspect of the invention, there is provided a method of cleaning a surface of an immersion lithographic projection apparatus, comprising: covering at least a part of the surface to be cleaned in liquid; and introducing megasonic waves into the liquid.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
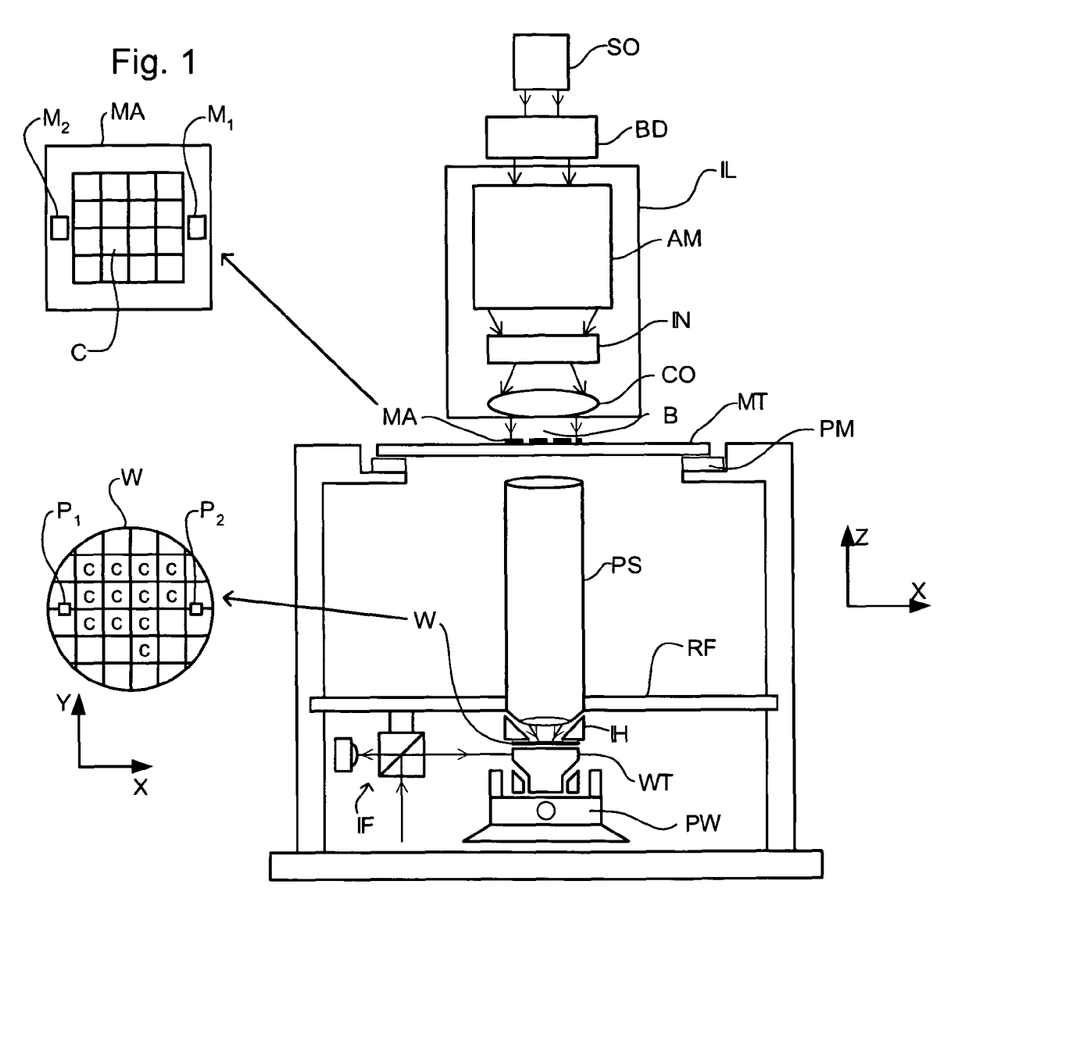
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
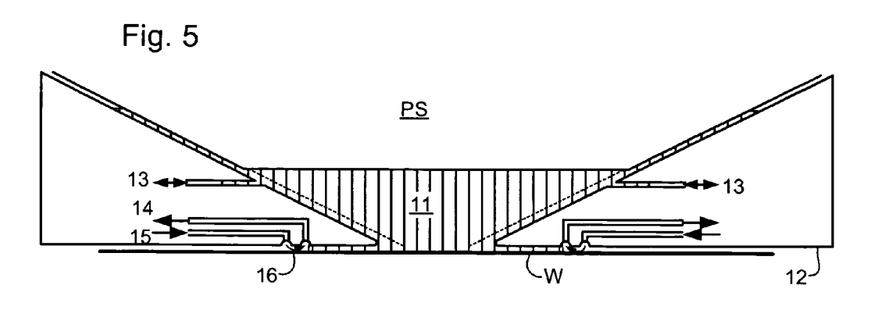
FIG. 5 depicts, in cross-section, another liquid supply system for use in an immersion lithographic apparatus.

Another immersion lithography solution with a localized liquid supply system solution which has been proposed is to provide the liquid supply system with a barrier member which extends along at least a part of a boundary of the space between the final element of the projection system and the substrate table. Such a solution is illustrated in FIG. 5. The barrier member is substantially stationary relative to the projection system in the XY plane though there may be some relative movement in the Z direction (in the direction of the optical axis). In an embodiment, a seal is formed between the barrier member and the surface of the substrate and may be a contactless seal such as a gas seal.

The barrier member 12 at least partly contains liquid in the space 11 between a final element of the projection system PS and the substrate W. A contactless seal 16 to the substrate may be formed around the image field of the projection system so that liquid is confined within the space between the substrate surface and the final element of the projection system. The space is at least partly formed by the barrier member 12 positioned below and surrounding the final element of the projection system PS. Liquid is brought into the space below the projection system and within the barrier member 12 by liquid inlet 13 and may be removed by liquid outlet 13. The barrier member 12 may extend a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

As noted above, an immersion lithographic apparatus is one in which a substrate is imaged through liquid. That is, an immersion liquid is provided between a final element of the projection system PS and the substrate. This arrangement may pose one or more particular problems. In particular, the liquid should be confined in the apparatus and also the liquid should be kept as free as possible of foreign object particles which may cause defects during imaging and/or by being left on the substrate surface after imaging and prior to downstream processing. Sometimes the immersion liquid includes particles in suspension deliberately.

One or more embodiments of the present invention addresses the problem of foreign object particles by providing an apparatus and a method to clean an immersion lithographic projection apparatus in which a cleaning liquid is applied to the surface to be cleaned and megasonic waves are introduced into the liquid to clean the surface. The cleaning liquid may or may not be the same as the immersion liquid. It could, for example, be ultra pure water.

Compared to ultrasonic waves, megasonic waves produce cavitation bubbles (which implode or vibrate) which are very small and therefore may go very close to the surface to be cleaned. However, there is a limit to the amount of energy which may be introduced into the liquid using megasonics. Generally whereas ultrasonic energy may be introduced into a liquid anywhere and will be distributed throughout the liquid, megasonic energy is only locally high and must therefore be directed directly to the surface to be cleaned. That is, a direct path (line of sight/straight) must be present between the transducer introducing the megasonic waves and the surface to be cleaned. The whole length of that path should be filled with liquid.

Megasonic frequencies are generally regarded to be between 750 kHz to 3 MHz. For the present purposes frequencies of above about 750 kHz, above 1 MHz or above 1.5 MHz are used.

A stagnant boundary layer in the cleaning fluid near the surface of an object to be cleaned becomes thinner as frequency of the introduced sonic energy is increased. At megasonic frequencies cleaning is partly accomplished by acoustic streaming with high velocity pressure waves in the cleaning fluid as well as bubble vibration and, to a lesser extent cavitation and bubble bursting.

At megasonic frequencies, particles of less than 0.5 μm in diameter may be removed without damage to the surface being cleaned. As mentioned above, there must be a clear path from the transducer to the surface being cleaned (line of sight). In order to further increase the cleaning efficiency, gas may be dissolved into the liquid to promote cavitation (bubble formation). Suitable gases are nitrogen, carbon dioxide or oxygen but other gases may also be suitable. The use of a surfactant in the liquid can further enhance cleaning efficiency.

Objects which one might want to clean in an immersion lithographic apparatus include, but not limited to, the substrate table WT which supports the substrate W (its top surface), the final element of the projection system PS which is immersed in immersion liquid during imaging and parts of the liquid confinement system (for example those illustrated in FIGS. 2-5) which provides liquid between the final element of the projection system PS and the substrate W during imaging.

In an embodiment, a liquid supply system is provided to provide liquid between a megasonic transducer and the surface to be cleaned. In the embodiment, the liquid supply system provides a flow of liquid so that liquid is removed as the surface is cleaned such that particles removed from the surface are carried away. One suitable liquid is water in an ultra pure form. However, other types of liquid may be suitable. Furthermore, an addition to the liquid such as a surfactant as mentioned above may also have an advantage. Other cleaning liquids are water/hydrogen peroxide, water/ethanol, water/ammonia or water/acetone mixtures, for example. Other chemicals which may be useful as an addition include TMAH and SC-1 or SC-2.

One reason for introducing gas (or some solvents) into the liquid is that this promotes stable cavitation. This results in stable bubbles being formed in the liquid. These bubbles are then vibrated by the megasonic waves which results in cleaning which is likely to do less damage to the surface being cleaned than so called transient cavitation which is cavitation where a solvent evaporates into a bubble and then implodes or collapses. These violent implosions may lead to damage of the surface and are typically seen at ultrasonic frequencies and are less significant at megasonic frequencies where the bubbles produced tend to be smaller than those produced at ultrasonic frequencies. However, as noted above, the megasonic waves need to be supplied in line of sight of the surface they are to clean.

A process time up to 100 seconds may lead to a particle removal efficiency of up to 100% at a frequency of about 1 MHz. If the acoustic frequency exceeds much more than 3 MHz the particle removal efficiency is dramatically decreased over a frequency of just above 1 MHz. The introduction of gas into the liquid has a major effect on the particle removal efficiency. Removal of 34 nm diameter $SiO_2$ particles may increase from zero removal efficiency to 30% removal efficiency with the introduction of oxygen at a level of 20 ppm into the liquid. Thus, a gas concentration of above about 5 ppm can be useful.

Temperature may also be important and a balance should be drawn between faster reaction time at a high temperature (say 55° C.) over less gas being dissolved at a high temperature.

There is also an effect of the pH of the liquid. At low pH, there are many H1 ions in the liquid which results in a positive surface charge. Similarly, at high pH the liquid contains many $OH^-$ ions which results in a negative surface charge. Therefore ensuring that the pH of the liquid is distant from pH 7 ensures that re-deposition of particles after they have been removed does not occur. Moreover, the electrostatic repulsion between the particle and the surface when both are charged equally (either positively or negatively) assists in lifting the particle from the surface.

The power of the transducer should be between 0.2 and 5 $W/cm^2$, the irradiation distance should be between 5 and 20 mm and a cleaning time should be between 10 and 90 seconds. For the acoustic waves from the megasonic transducer to travel a direct path to the surface to be cleaned from the megasonic transducer, several designs are proposed to clean different parts of the immersion lithographic apparatus.

Figure 6:
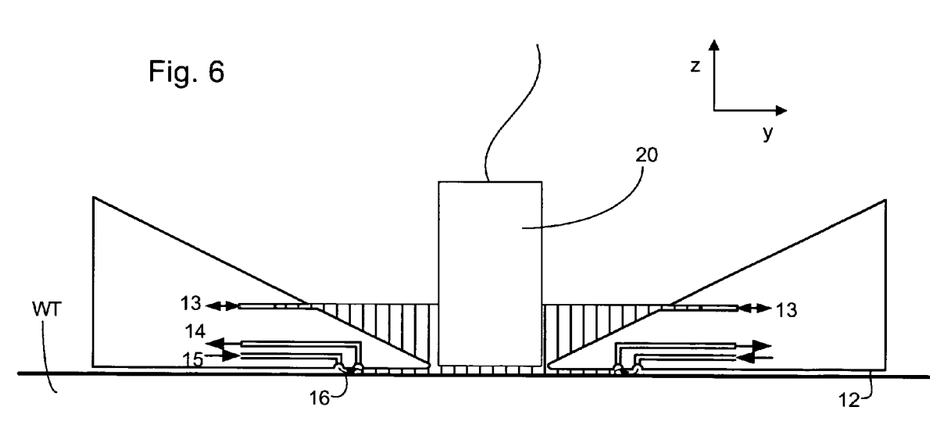
FIG. 6 illustrates, in cross-section, a first embodiment of the present invention to clean a substrate table.

A first embodiment is illustrated in FIG. 6 which may be used, for instance, to clean a top surface of a substrate table WT. In this embodiment the liquid supply system comprises a barrier member 12 which surrounds a transducer 20. The barrier member 12 could be similar to that of the liquid confinement system of FIG. 5 in that it comprises a gas seal device 14, 15 to create a seal between the bottom of the barrier member 12 and the top surface of the substrate table WT using a flow of gas 16. The transducer 20 which fits inside the barrier member 12 may thereby be positioned very close to the surface of the substrate table WT. This is an advantage because the transducer 20 should be quite small in order to fit inside the barrier member 12 and therefore should be positioned relatively close to the top surface of the substrate table WT being cleaned (because it has low power). In an embodiment, the megasonic transducer 20 is less than 1.5 mm or less than 1.6 mm away from the surface it is cleaning. A flow of liquid is provided across the barrier member 12 and the bottom of the transducer 20 is covered in liquid.

The substrate table WT and/or the barrier member 12 and transducer 20 are moved relative to the other so that all of the top surface of the substrate table WT may be cleaned. The cleaning could take place within the lithographic apparatus in an automated way or could be carried out by hand by passing the barrier member 12 and transducer 20 over the top surface of the substrate table WT by hand.

If the cleaning process is automated, one way of arranging for this is to provide the barrier member 12 and transducer 20 arrangement to be moveable from a stationary store position to a (stationary) clean position and to move the substrate table WT relative to the transducer 20 when the transducer is in the (stationary) clean position. The substrate table WT may need to be moved in the Z axis prior to activation of the liquid supply system of the cleaning device. Once the gas flow 16 has been created the barrier member 12 is supplied with liquid and the substrate table WT is moved in the X-Y plane so that the surfaces which are desired to be cleaned can be cleaned.

Figure 7:
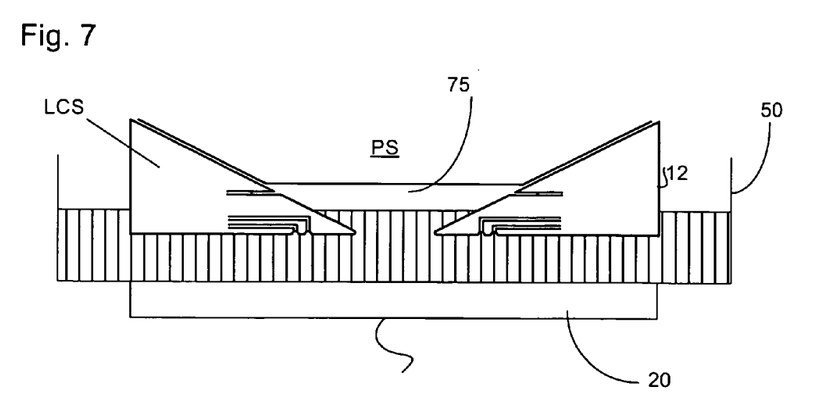
FIG. 7 illustrates, in cross-section, a second embodiment of the present invention to clean a liquid supply system.

FIG. 7 illustrates a second embodiment which is used in order to clean a liquid confinement system LCS, such as one illustrated in FIGS. 2-5, which is positioned around the final element of the projection system PS. In FIG. 7 a liquid confinement system in accordance with that shown in FIG. 5 is illustrated as an example.

In this embodiment a moveable bath 50 is provided which has on its bottom surface a megasonic transducer 20. The megasonic transducer 20 of the second embodiment may be larger than the megasonic transducer of the first embodiment because there are no particular size constraints. Thus, the distance between the megasonic transducer and the surface to be cleaned (the bottom surface of the liquid confinement system) can be made larger and up to 50 mm. In an embodiment, the distance is less than 40 mm or less than 30 mm.

A controller controls the position of the bath 50 which is moveable between a store position and a cleaning position (as illustrated) and which controls the level of fluid in the bath 50. In one embodiment the level of liquid is controlled so as to cover the bottom surface of the liquid confinement system LCS but not to cover the final element of the projection system PS. Thus, the gap 75 is not filled with liquid. This is to protect the final element of the projection system from the sonic waves and/or the cleaning liquid which could damage it. Additionally or alternatively, a shield (perhaps in the form of a plate) may be used to shield the final element of the projection system from megasonic waves and/or liquid. In an embodiment, this bath arrangement may be used to clean the final element of the projection system PS and in which case the controller increases the level of liquid in the bath 50 so that the final element of the projection system PS is covered in liquid.

In the second embodiment illustrated in FIG. 7, the bath 50 and/or transducer 20 may be moveable relative to the projection system PS in the cleaning position and liquid confinement system LCS such that the whole under surface of the liquid confinement system LCS may be cleaned. Of course, this need not be implemented if the transducer 20 is large enough to clean the whole bottom surface of the liquid confinement system LCS (or just a desired portion thereof) without being moved.

Figure 8:
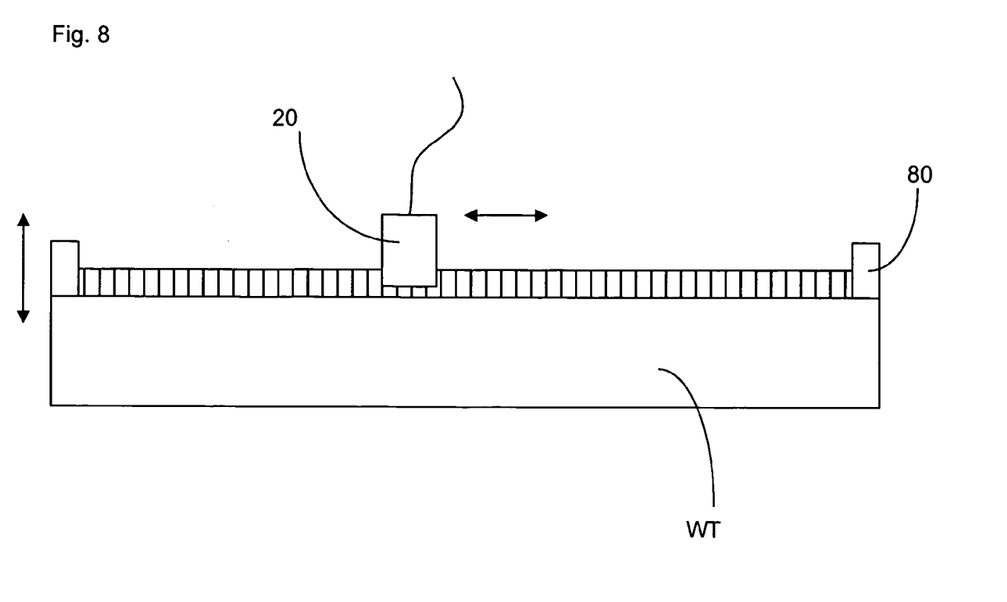
FIG. 8 illustrates, in cross-section, a third embodiment of the invention to clean a substrate table.

In a third embodiment illustrated in FIG. 8, which is used to clean, for example, the top surface of the substrate table WT, the substrate table WT is provided with a retractable barrier 80 which, in its clean position extends above and around the top surface of the substrate table WT to be cleaned. Once the barrier 80 has been raised to its cleaning position liquid can be provided on the surface to be cleaned and a megasonic transducer 20 can be moved over the surface of the substrate table WT (with the bottom surface of the transducer 20 covered by liquid) and/or the substrate table W1 may be moved under the transducer 20, thereby to clean the top surface of the substrate table WT. Of course a similar embodiment is possible where the barrier 80 is not retractable and is permanently attached to the substrate table WT or is a removable part. The transducer 20 could be fixed or moveable (particularly in the Z direction) and/or also moveable in the X/Y axis during the cleaning operation.

When the top surface of the substrate table WT is cleaned, it is also possible to clean at the same time one or more sensors provided on the top surface of the substrate table WT. Examples of types of sensors include a transmission image sensor, a lens interferometer, and/or a spot sensor.

In an embodiment, it may be useful to ensure that the acoustic waves produced by the transducer impinge at 90° onto the surface to be cleaned. For this purpose, a micrometer may be provided to adjust the tilt of the transducer 20 relative to the surface to be cleaned. In an embodiment, it may be advantageous to provide the transducer tilted relative to the surface and again, this can be adjusted using a micrometer. A micrometer may also be used to adjust the distance from the transducer to the surface to be cleaned. In all embodiments, a flow of liquid across the distance between the transducer and the surface to be cleaned is desirable though not essential.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. An immersion lithographic projection apparatus, comprising:
   a substrate table constructed and arranged to hold a substrate;
   a projection system configured to project a patterned beam of radiation onto the substrate;
   a megasonic transducer configured to clean a surface; and
   a liquid supply system constructed and arranged to supply a flow of liquid between the megasonic transducer and the surface to be cleaned while the megasonic transducer is providing megasonic waves directed toward the surface being cleaned,
   wherein the megasonic transducer is physically separate from the liquid supply system and movable with respect to the liquid supply system and the megasonic transducer is arranged, in use, to emit megasonic waves that do not substantially impinge the projection system.

2. The apparatus of claim 1, wherein the megasonic transducer has a frequency of above 1 MHz.

3. The apparatus of claim 1, wherein the liquid supply system comprises a barrier member which surrounds a lower end of the megasonic transducer and which forms a seal between the barrier member and the surface to be cleaned, thereby to contain liquid between the megasonic transducer and the surface to be cleaned.

4. The apparatus of claim 3, wherein the barrier member, the transducer, or both, is moveable relative to the surface.

5. The apparatus of claim 3, wherein the seal is a gas seal.

6. The apparatus of claim 3, wherein the surface is a top surface of the substrate table.

7. The apparatus of claim 1, wherein the megasonic transducer is positioned, in a cleaning mode, to face the surface such that sonic waves are directed in a line of sight path to the surface to be cleaned.

8. The apparatus of claim 1, wherein the surface is a surface of the substrate table, a surface of a liquid confinement system constructed to provide liquid between the projection system and a substrate to be exposed, or both.

9. The apparatus of claim 1, wherein the liquid supply system comprises a bath and a controller configured to fill the bath with liquid to a certain level.

10. The apparatus of claim 9, wherein the megasonic transducer is positioned in a bottom of the bath to induce sonic waves, directed away from the bottom of the bath, in liquid in the bath.

11. The apparatus of claim 9, wherein the bath is moveable to a cleaning position under the projection system and to at least partly enclose a liquid confinement system constructed to provide, in use, liquid between the projection system and a substrate to be exposed, and the certain level is below the bottom of the projection system but above a bottom surface of the liquid confinement system.

12. The apparatus of claim 1, wherein the liquid supply system comprises a barrier which surrounds a top surface of the substrate table, such that liquid can be provided on the top surface and be prevented from escaping by the barrier.

13. The apparatus of claim 12, wherein the barrier is moveable between a cleaning position and a non-cleaning position.

14. The apparatus of claim 1, wherein the megasonic transducer is moveable relative to the surface.

15. The apparatus of claim 1, further comprising a shield to shield an optical element of the projection system from megasonic waves, liquid, or both.

16. The apparatus of claim 1, further comprising a gas supply configured to introduce gas into the liquid.

17. The apparatus of claim 16, wherein the gas is $N_2$, $CO_2$ or $O_2$.

18. The apparatus of claim 1, further comprising a surfactant supplier to supply surfactant to the liquid.

19. An immersion lithographic projection apparatus, comprising:
   a substrate table constructed and arranged to hold a substrate;
   a projection system configured to project a patterned beam of radiation onto the substrate;
   a megasonic transducer configured to clean a surface and produce megasonic waves having a frequency from the range of about 750 kHz to 3 MHz, the megasonic transducer being moveable relative to the surface such that, in a cleaning mode, a direct straight path through liquid exists between the megasonic transducer and the surface;
   a liquid supply system configured to provide liquid between the transducer and the surface; and
   a gas supply configured to introduce gas into the liquid,
   wherein the megasonic transducer is physically separate and movable with respect to the liquid supply system.

20. The apparatus of claim 19, wherein, in the cleaning mode, the megasonic transducer and the surface face each other at a distance of less than 50 mm.

21. The apparatus of claim 19, wherein, in the cleaning mode, the megasonic transducer and the surface face each other at a distance of less than 50 mm, and wherein the surface is a surface of a liquid confinement system constructed to provide liquid between the projection system and a substrate to be exposed.

22. The apparatus of claim 19, wherein the gas is $N_2$, $CO_2$ or $O_2$.

23. The apparatus of claim 19, further comprising a surfactant supplier configured to supply surfactant to the liquid.

24. The apparatus of claim 19, further comprising a liquid level controller configured to control the level of liquid supplied by the liquid supply system.

25. The apparatus of claim 19, further comprising a shield configured to protect a final element of the projection system from megasonic waves produced by the megasonic transducer, the liquid or both.

26. The apparatus of claim 19, wherein the liquid supply system is configured to provide liquid to a level that is below the bottom of the projection system but above a bottom surface of a liquid confinement system.

27. A method of cleaning a surface of an immersion lithographic projection apparatus having a projection system, comprising:
   covering at least a part of the surface to be cleaned in a flow of liquid using a liquid supply system; and introducing megasonic waves into and during the flow of liquid to clean the surface using a megasonic transducer that is physically separate from and movable with respect to the liquid supply system, the megasonic waves substantially not impinging the projection system.

28. The method of claim 27, wherein the megasonic transducer has a frequency of above about 750 kHz.

29. The method of claim 27, comprising moving the megasonic transducer relative to the surface to be cleaned.

30. The method of claim 27, wherein the megasonic waves impinge perpendicularly to the surface to be cleaned.

31. The method of claim 27, wherein the megasonic waves impinge at an angle to the surface to be cleaned.

32. The method of claim 27, comprising positioning a megasonic transducer, in a cleaning mode, to face the surface such that the megasonic waves are directed in a line of sight path to the surface to be cleaned.

33. The method of claim 27, further comprising introducing gas into the liquid.

34. The method of claim 27, further comprising introducing a surfactant into the liquid.

* * * * *

UNITED STATES PATENT AND TRADEMARK OFFICE
CERTIFICATE OF CORRECTION

| | | |
|---|---|---|
| PATENT NO. | : 7,969,548 B2 | Page 1 of 1 |
| APPLICATION NO. | : 11/437876 | |
| DATED | : June 28, 2011 | |
| INVENTOR(S) | : Marco Koert Stavenga et al. | |

It is certified that error appears in the above-identified patent and that said Letters Patent is hereby corrected as shown below:

On page 3, item (56) References Cited - Other Publications, Column 2, Fourteenth (14) reference from the top
  replace "De Jong et al., U.S. Appl. No. 11/819,954, filed Jun. 29, 2007."
  with --De Jong et al., U.S. Appln. No. 11/819,959, filed Jun. 29, 2007.--

Signed and Sealed this
Fourth Day of October, 2011

David J. Kappos
*Director of the United States Patent and Trademark Office*